(12) United States Patent  
Kobayashi et al.

(10) Patent No.: US 11,894,013 B2  
(45) Date of Patent: Feb. 6, 2024

(54) SOUND COLLECTION LOUDSPEAKER APPARATUS, METHOD AND PROGRAM FOR THE SAME

(71) Applicant: NIPPON TELEGRAPH AND TELEPHONE CORPORATION, Tokyo (JP)

(72) Inventors: Kazunori Kobayashi, Tokyo (JP); Shoichiro Saito, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 17/263,522

(22) PCT Filed: Jul. 10, 2019

(86) PCT No.: PCT/JP2019/027245  
§ 371 (c)(1),  
(2) Date: Jan. 26, 2021

(87) PCT Pub. No.: WO2020/026725  
PCT Pub. Date: Feb. 6, 2020

(65) Prior Publication Data  
US 2021/0233552 A1 Jul. 29, 2021

(30) Foreign Application Priority Data  
Aug. 2, 2018 (JP) .................................. 2018-145950

(51) Int. Cl.  
*G10L 21/0324* (2013.01)  
*H04R 3/00* (2006.01)  
*B60N 2/90* (2018.01)

(52) U.S. Cl.  
CPC ............ *G10L 21/0324* (2013.01); *H04R 3/00* (2013.01); *B60N 2/90* (2018.02); *H04R 2499/13* (2013.01)

(58) Field of Classification Search  
CPC ... G10L 21/0324; H04R 3/00; H04R 2499/13; B60N 2/90  
(Continued)

(56) References Cited

U.S. PATENT DOCUMENTS

2016/0029111 A1* 1/2016 Wacquant .............. H04R 3/005  
381/86

FOREIGN PATENT DOCUMENTS

JP     11-298989 A     10/1999  
JP     11298989 A * 10/1999  
(Continued)

OTHER PUBLICATIONS

"Technology of 'Intelligent microphone for car'", [online], 2018, Nippon Telegraph and Telephone Corporation, accessed May 24, 2018, Internet, Retrieved from: URL:http://www.ntt.co.jp/news2018/1802/pdf/180219c.pdf, with translation generated by machine.

*Primary Examiner* — Paul Kim

(57) ABSTRACT

Provided is a sound pickup loudspeaker apparatus that has a mechanism for detecting situations in which sound amplification should not be performed and stopping sound amplification from a speaker. The sound pickup loudspeaker apparatus is installed in a vehicle. At least a sound pickup position and a sound amplification position are assumed to be present in the vehicle. The sound pickup loudspeaker apparatus includes a noise level estimation unit that determines a noise level that is an estimated value of the magnitude of a noise component included in a sound pickup signal obtained from a microphone that collects sound emitted from the sound pickup position, and a control unit that performs control such that (i) when the noise level is not (Continued)

greater than a predetermined threshold value or is less than the threshold value, an acoustic signal based on the sound pickup signal is played back from a speaker at the sound amplification position, and (ii) when the noise level is greater than the threshold value or is at least the threshold value, the acoustic signal is not played back from the speaker.

5 Claims, 13 Drawing Sheets

(58) Field of Classification Search
USPC .......................................................... 381/86
See application file for complete search history.

(56) References Cited

FOREIGN PATENT DOCUMENTS

| JP | 2000-047671 A | | 2/2000 |
|----|---------------|---|---------|
| JP | 2000047671 A | * | 2/2000 |
| JP | 2012-195801 A | | 10/2012 |
| JP | 2012195801 A | * | 10/2012 |
| JP | 2019-068237 A | | 4/2019 |

* cited by examiner

SOUND COLLECTION LOUDSPEAKER APPARATUS, METHOD AND PROGRAM FOR THE SAME

CROSS-REFERENCE TO RELATED APPLICATIONS

This application is a U.S. 371 Application of International Patent Application No. PCT/JP2019/027245, filed on 10 Jul. 2019, which application claims priority to and the benefit of JP Application No. 2018-145950, filed on 2 Aug. 2018, the disclosures of which are hereby incorporated herein by reference in their entireties.

TECHNICAL FIELD

The present invention relates to a sound pickup and amplification technique which uses a microphone and a speaker to enable conversations to be had smoothly inside a vehicle.

BACKGROUND ART

Functions known as "in-car communication", "conversation assistance", and the like are increasingly being provided in automobiles (see NON-PATENT LITERATURE 1). Such a function facilitates conversations by collecting the sound of the voice of a person occupying a front seat by using a microphone 91F and playing back that voice by using a speaker 92R provided at a rear seat (see FIG. 1). Some such functions also collect audio from the rear seat by using a microphone 91R and play back that audio by using a speaker 92F provided at the front seat (see FIG. 2).

CITATION LIST

Non Patent Literature

[NON-PATENT LITERATURE 1] "Intelligent mic for car no gijutu ni tuite (About 'Intelligent Microphone' Technology for Cars)", [online], 2018, Nippon Telegraph and Telephone Corporation, [May 24, 2018]. Retrieved from <URL: http://www.ntt.co.jp/news2018/1802/pdf/180219c.pdf>

SUMMARY OF THE INVENTION

Technical Problem

Although sounds collected by the microphones 91F and 91R are respectively played back from the speakers 92R and 92F, if the wind blows against the microphones 91F and 91R or the microphones 91F and 91R are rubbed with a hand, extremely loud noise is played back from the speakers 92R and 92F and a user may feel unpleasant.

It is an object of the present invention to provide a sound pickup loudspeaker apparatus (Hereinafter also referred to as "sound pickup and amplification device"), a method thereof, and a program that have a mechanism for detecting situations in which sound amplification should not be performed and stopping sound amplification from a speaker.

Means for Solving the Problem

To solve the above-described problem, according to one aspect of the present invention, a sound pickup loudspeaker apparatus is installed in a vehicle. At least a sound pickup position and a sound amplification position are assumed to be present in the vehicle. The sound pickup loudspeaker apparatus includes: a noise level estimation unit that determines a noise level that is an estimated value of the magnitude of a noise component included in a sound pickup signal obtained from a microphone that collects sound emitted from the sound pickup position; and a control unit that performs control such that (i) when the noise level is not greater than a predetermined threshold value or is less than the threshold value, an acoustic signal based on the sound pickup signal is played back from a speaker at the sound amplification position, and (ii) when the noise level is greater than the threshold value or is at least the threshold value, the acoustic signal is not played back from the speaker.

To solve the above-described problem, according to another aspect of the present invention, a sound pickup loudspeaker apparatus is installed in a vehicle. At least a sound pickup position and a sound amplification position are assumed to be present in the vehicle. The sound pickup loudspeaker apparatus includes a control unit that performs control such that (i) when a level of a music signal output from an onboard acoustic device installed in the vehicle is not greater than a predetermined threshold value or is less than the threshold value, an acoustic signal based on a sound pickup signal obtained from a microphone that collects sound emitted from the sound pickup position is played back from a speaker at the sound amplification position, and (ii) when the level of the music signal is greater than the threshold value or is at least the threshold value, the acoustic signal is not played back from the speaker.

To solve the above-described problem, according to another aspect of the present invention, a sound pickup loudspeaker apparatus is installed in a vehicle. At least a sound pickup position and a sound amplification position are assumed to be present in the vehicle. The sound pickup loudspeaker apparatus includes a control unit that performs control such that (i) when an opening portion of the vehicle is closed by opening and closing means disposed at the opening portion, an acoustic signal based on a sound pickup signal obtained from a microphone that collects sound emitted from the sound pickup position is played back from a speaker at the sound amplification position, and (ii) when the opening portion is open, the acoustic signal is not played back from the speaker.

To solve the above-described problem, according to another aspect of the present invention, a sound pickup loudspeaker apparatus is installed in a vehicle. At least a sound pickup position and a sound amplification position are assumed to be present in the vehicle. The sound pickup loudspeaker apparatus includes: a correlation acquiring unit that determines a correlation between M sound pickup signals obtained from M microphones that collect sound emitted from the sound pickup position; and a control unit that performs control such that (i) when the correlation is high, an acoustic signal based on the sound pickup signals is played back from a speaker at the sound amplification position, and (ii) otherwise, the acoustic signal is not played back from the speaker.

To solve the above-described problem, according to another aspect of the present invention, a sound pickup loudspeaker apparatus is installed in a vehicle. At least a sound pickup position and a sound amplification position are assumed to be present in the vehicle. The sound pickup loudspeaker apparatus includes: a sound pickup signal level calculation unit that determines a level of a sound pickup signal obtained from a microphone that collects sound emitted from the sound pickup position; and a control unit that performs control such that (i) when the level of the sound pickup signal is not greater than a predetermined threshold value or is less than the threshold value, an acoustic signal based on the sound pickup signal is played back from a speaker at the sound amplification position, and (ii) when the level of the sound pickup signal is greater than the threshold value or is at least the threshold value, the acoustic signal is not played back from the speaker.

Effects of the Invention

The present invention provides an effect in which situations in which sound amplification should not be performed can be detected and sound amplification from a speaker can be stopped to prevent a user from feeling unpleasant.

DESCRIPTION OF EMBODIMENTS

Figure 1:
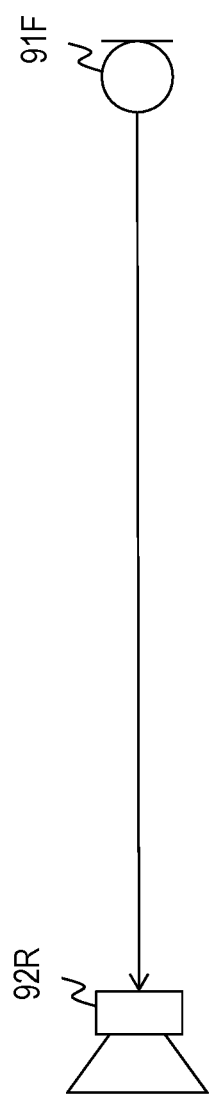
FIG. 1 is a diagram for explaining a vehicle according to an embodiment of the present invention.

Embodiments of the present invention will be described below. In the figures referred to in the following descriptions, constituent elements having the same functions, steps performing the same processing, and the like will be given like reference numerals, and redundant descriptions thereof will not be given. Unless otherwise mentioned, the following descriptions will assume that processing carried out in units of elements of vectors, matrices, and so on is applied to all of those elements of vectors, matrices, and so on.

First Embodiment

Figure 3:
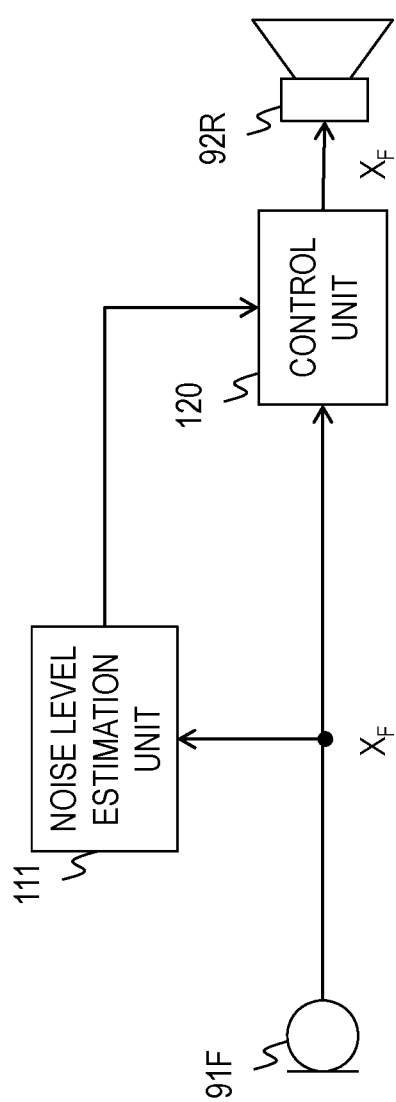
FIG. 3 is a function block diagram illustrating a sound pickup and amplification device according to a first embodiment.
Figure 4:
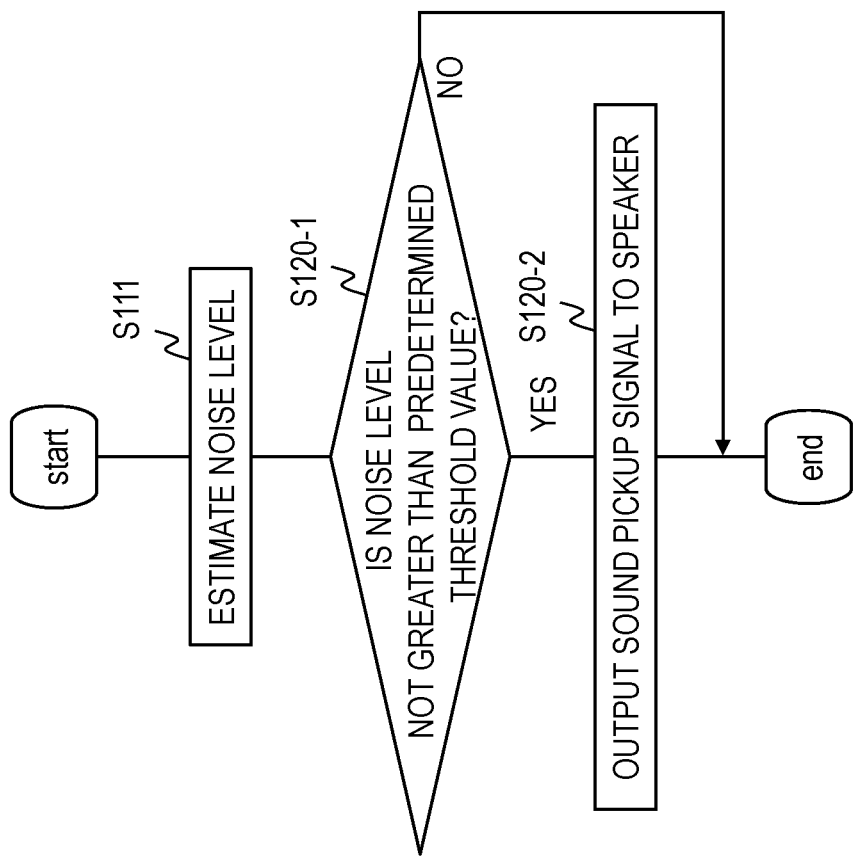
FIG. 4 is a diagram illustrating an example of a flow of processing by the sound pickup and amplification device according to the first embodiment.

FIG. 3 is a function block diagram illustrating a sound pickup and amplification device according to a first embodiment, and FIG. 4 illustrates a processing flow thereof.

The sound pickup and amplification device includes a noise level estimation unit 111 and a control unit 120.

The sound pickup and amplification device takes, as an input, a sound pickup signal $X_F$ obtained from a microphone 91F, and outputs the signal $X_F$ to a speaker 92R. Note that the signal $X_F$ is a complex number indication of a given frequency component. Here, the signal $X_F$ in the frequency domain may be input and output as-is. Alternatively, a time domain signal may be input, and a frequency domain conversion unit (not shown) may be used to convert (e.g., through a Fourier transform or the like) the signal into the signal $X_F$ in the frequency domain. Alternatively, the frequency domain signal $X_F$ may be converted (e.g., through an inverse Fourier transform or the like) into a signal in the time domain using a time domain conversion unit (not shown) and output as the time domain signal.

Figure 2:
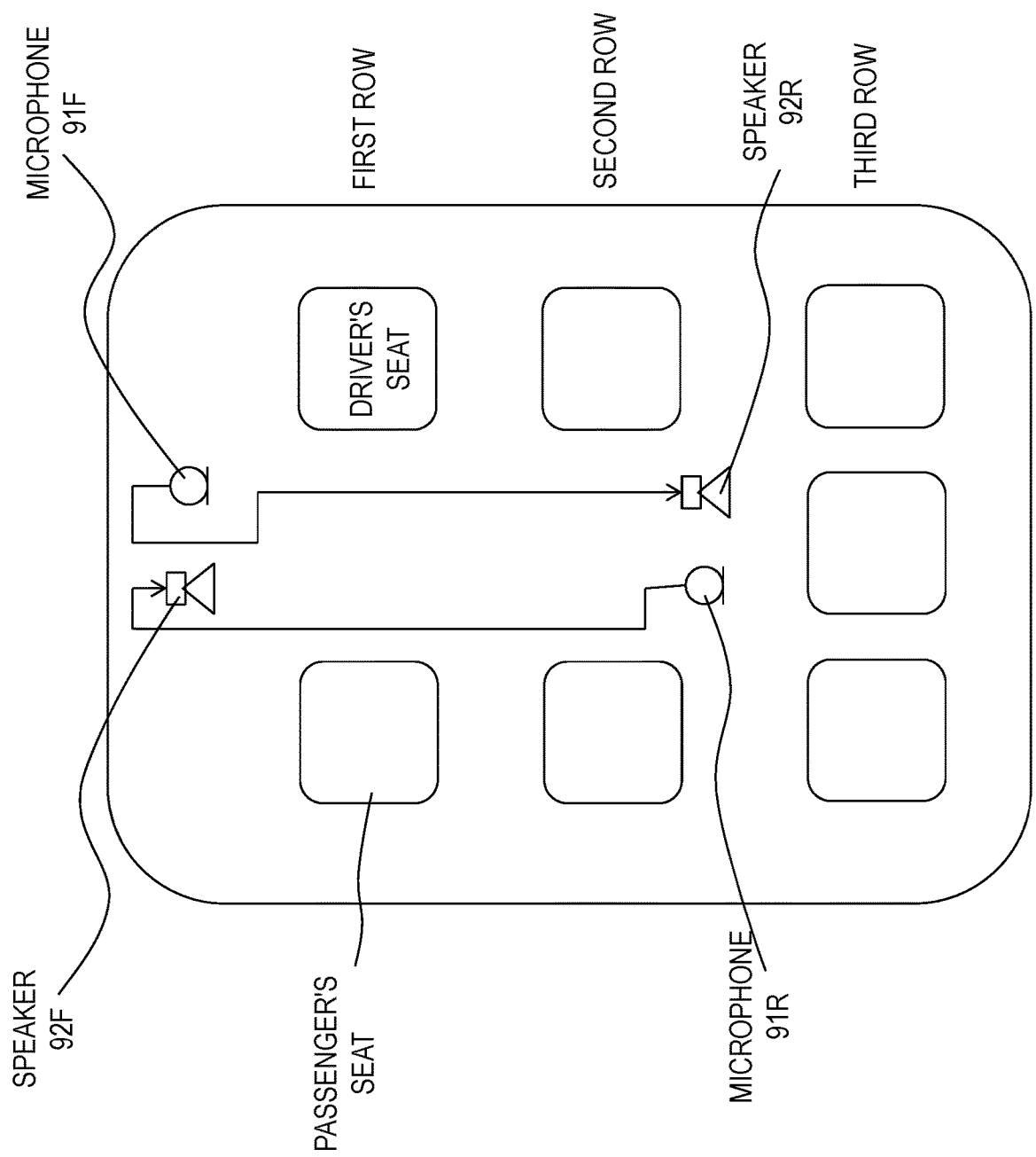
FIG. 2 is a diagram illustrating an example of an automobile having a function known as "in-car communication".

In the present embodiment, a vehicle in which the sound pickup and amplification device is installed has the structure illustrated in FIG. 2, with three rows of seats. Furthermore, the vehicle according to the present embodiment includes the microphone 91F that collects sound mainly of the voice of a talker in the first row. The microphone 91F is constituted by M microphones. M is any integer greater than or equal to 1. Furthermore, the vehicle according to the present embodiment includes the speaker 92R that plays back sound to a listener in a seat in the third row. Note that a microphone 91R and a speaker 92F are not provided in the present embodiment. The speaker 92R is constituted by M speakers. Note that a configuration in which sound collected by the M microphones is played back by each of the M speakers is employed in the present embodiment, but a configuration is also possible in which signal processing (e.g., beam forming, noise suppression, or echo cancelling) is performed on the sound collected by the M microphones, N playback signals are generated, and the playback signals are played back by P speakers. N and P are each any integer greater than or equal to 1. For example, it is also possible to generate two (N=2) playback signals (stereo signals) and play back the signals by using two (P=2) speakers disposed on the left and the right of a listener, respectively, or generate one (N=1) playback signal (monaural signal) and play back the signal by using two (P=2) speakers disposed on the left and the right of a listener. Each speaker plays back a sound pickup signal itself or an acoustic signal based on the sound pickup signal (i.e., a signal obtained by performing beam forming processing, noise suppression processing, or echo cancelling processing on the sound pickup signal).

The sound pickup and amplification device is a special device configured by loading a special program into a known or dedicated computer including, for example, a central processing unit (CPU), a main storage device (RAM: Random Access Memory), and the like. The sound pickup and amplification device executes various types of processing under the control of the central processing unit, for example. Data input to the sound pickup and amplification device, data obtained from the various types of processing, and so on is, for example, stored in the main storage device, and the data stored in the main storage device is read out to the central processing unit and used in other processing as necessary. The various processing units of the sound pickup and amplification device may be at least partially constituted by hardware such as integrated circuits. The various storage units provided in the sound pickup and amplification device can, for example, be constituted by the main storage device such as RAM (Random Access Memory), or by middleware such as relational databases or key value stores. However, it is not absolutely necessary for the storage units to be provided within the sound pickup and amplification device; the units may be constituted by an auxiliary storage device including a hard disk, an optical disc, or a semiconductor memory element such as flash memory, and provided outside the sound pickup and amplification device.

Each unit will be described hereinafter.

Noise Level Estimation Unit 111

The noise level estimation unit 111 takes the sound pickup signal $X_F$ as an input, determines a noise level $N_F$ that is an estimated value of the magnitude of a noise component included in the sound pickup signal $X_F$ (S111), and outputs the noise level $N_F$. Hereinafter, the sound pickup signal $X_F$ and the noise level $N_F$ will be expressed as $X_F(\omega, n)$ and $N_F(\omega, n)$, respectively, to clearly indicate that the processing is performed for each frequency and each frame. Note that ω represents a frequency and n represents a frame number.

Figure 5:
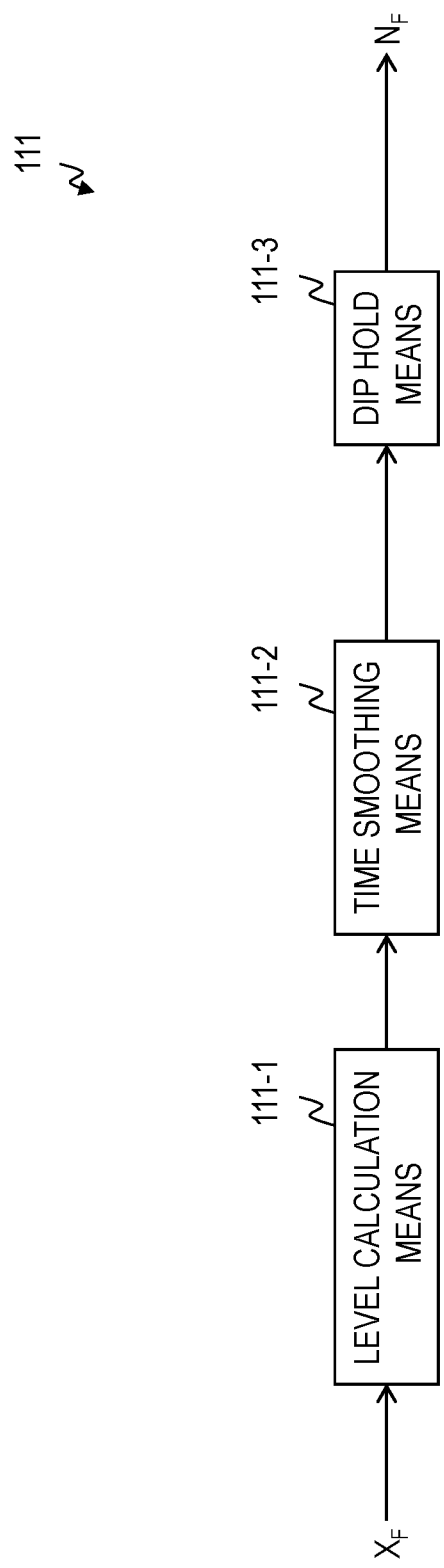
FIG. 5 is a function block diagram illustrating a noise level estimation unit according to the first embodiment.

FIG. 5 illustrates an example of a more specific functional configuration of the noise level estimation unit 111. The noise level estimation unit 111 includes a level calculation means 111-1, a time smoothing means 111-2, and a dip hold means 111-3.

The level calculation means 111-1 determines the magnitude of the sound pickup signal $X_F(\omega, n)$. The magnitude means the absolute value $|X_F(\omega, n)|$ of the sound pickup signal $X_F(\omega, n)$ or a power $|X_F(\omega, n)|^2$ thereof, and the level calculation means 111-1 determines at least any of these values through calculation. The magnitude is a value that can also be called a level.

The time smoothing means 111-2 calculates a sound pickup signal level $Z_F(\omega, n)$ (Expression (1) or (2)) that is obtained by performing time smoothing on the level of the sound pickup signal expressed by the absolute value or power. In Expressions (1) and (2), a represents a smoothing coefficient and takes a value equal to or greater than 0 and less than 1. The smoothing is performed with respect to a longer period of time as a approaches 1.

$$Z_F(\omega,n)=\alpha Z_F(\omega,n-1)+(1-\alpha)|X_F(\omega,n)| \quad (1)$$

or $$Z_F(\omega,n)=\alpha Z_F(\omega,n-1)+(1-\alpha)|X_F(\omega,n)|^2 \quad (2)$$

The dip hold means 111-3 determines the noise level $N_F(\omega, n)$ by performing dip hold processing for holding the minimum value shown by the following expressions, for example, on the sound pickup signal level $Z_F(\omega, n)$ subjected to the time smoothing.

$$N_F(\omega,n)=Z(\omega,n) \text{ for } N_F(\omega,n-1) \geq Z(\omega,n)$$

$$N_F(\omega,n)=uZ(\omega,n-1) \text{ for } N_F(\omega,n-1)<Z(\omega,n)$$

If the noise level $N_F(\omega, n-1)$ of an immediately preceding frame is greater than the sound pickup signal level $Z(\omega, n)$ subjected to the time smoothing, the sound pickup signal level $Z(\omega, n)$ subjected to the time smoothing is substituted for the noise level $N_F(\omega, n)$ to be estimated, and otherwise the noise level is slightly increased by multiplying the noise level $N_F(\omega, n-1)$ of the immediately preceding frame by a constant u that is greater than or equal to 1. The constant u is set in advance. u is an increase coefficient for the noise level, and the closer u is to 1, the more gradually the noise level is increased.

Control Unit 120

The control unit 120 takes the sound pickup signal $X_F$ and the noise level $N_F$ as inputs, and (i) when the noise level $N_F$ is not greater than a predetermined threshold value or is less than the threshold value, outputs the sound pickup signal $X_F$ to the speaker 92R (YES in S120-1, S120-2).

On the other hand, (ii) when the noise level is greater than the threshold value or is at least the threshold value, the sound pickup signal $X_F$ is not output to the speaker 92R (NO in S120-1). This can also be said that a sound path from the microphone 91F to the speaker 92R is interrupted. In other words, (i) when the noise level $N_F$ is not greater than the predetermined threshold value or is less than the threshold value, control is performed such that the sound pickup signal $X_F$ is played back from the speaker 92R at a sound amplification position, and (ii) when the noise level is greater than the threshold value or is at least the threshold value, control is performed such that the sound pickup signal $X_F$ is not played back from the speaker 92R.

Note that control may also be performed to sufficiently reduce the sound volume to an extent that the user does not feel unpleasant, instead of performing control such that the sound pickup signal is not played back at all. For example, control may also be performed to reduce the sound volume by 20 db. Here, "performing control such that the sound pickup signal $X_F$ is not played back from the speaker 92R" may mean performing control such that the sound pickup signal is not played back at all or performing control such that the sound pickup signal is not played back at a sound volume that makes the user unpleasant. This also applies to other embodiments.

<Effects>

According to the configuration described above, a sound amplification function can be stopped if noise is so large that a sound should not be played back from the speaker 92R.

<Variation>

Although a configuration in which audio is collected from the front seat by the microphone 91F and played back at the rear seat by the speaker 92R is described in the present embodiment, the present embodiment can be similarly applied in a configuration in which audio is collected from the rear seat in FIG. 2 by the microphone 91R and played back at the front seat by the speaker 92F. This also applies to the following embodiments.

Second Embodiment

The following will primarily describe differences from the first embodiment.

Figure 6:
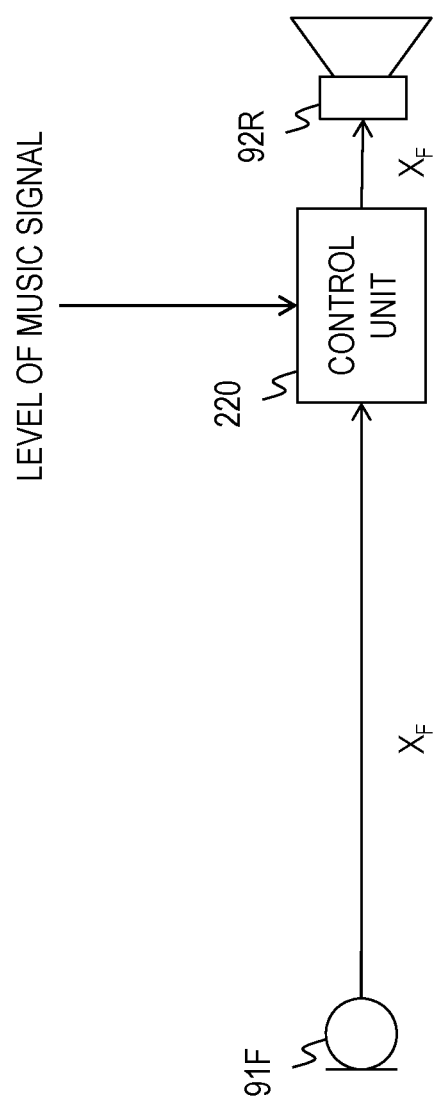
FIG. 6 is a function block diagram illustrating a sound pickup and amplification device according to a second embodiment.
Figure 7:
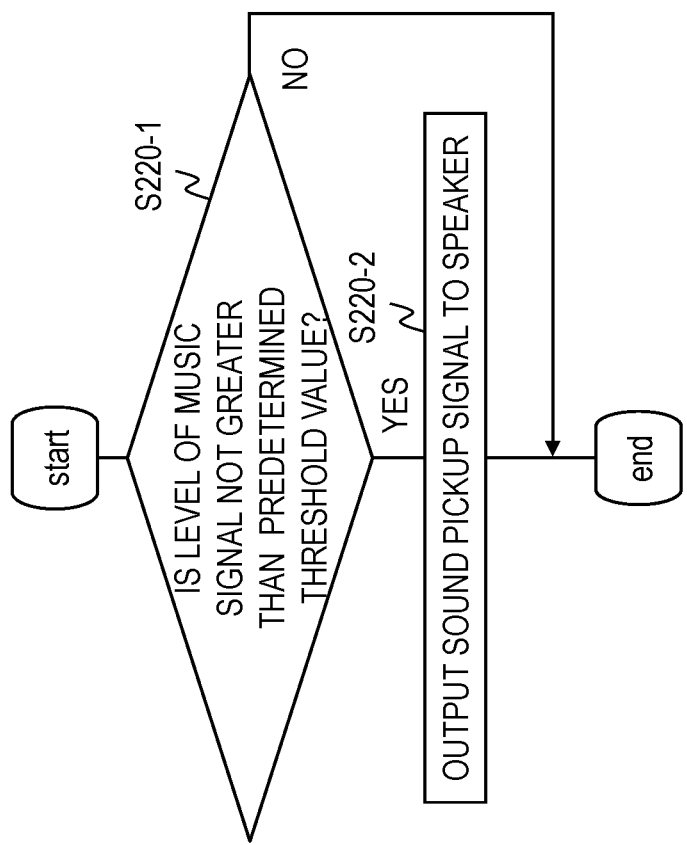
FIG. 7 is a diagram illustrating an example of a flow of processing by the sound pickup and amplification device according to the second embodiment.

FIG. 6 is a function block diagram illustrating a sound pickup and amplification device according to a second embodiment, and FIG. 7 illustrates a processing flow thereof.

The sound pickup and amplification device includes a control unit 220.

The sound pickup and amplification device takes a sound pickup signal $X_F$ obtained from the microphone 91F and a level of a music signal as inputs and outputs the sound pickup signal $X_F$ to the speaker 92R. An onboard acoustic device (e.g., a car audio system, not shown) is installed in a vehicle according to the present embodiment, and the above-described music signal is played back from a speaker of the onboard acoustic device. In the present embodiment, the onboard acoustic device outputs the level (sound volume information or the like) of the music signal and the level is input to the sound pickup and amplification device.

<Control Unit 220>

The control unit 220 takes the sound pickup signal $X_F$ and the level of the music signal as inputs, and (i) when the level of the music signal is not greater than a predetermined threshold value or is less than the threshold value, outputs the sound pickup signal $X_F$ to the speaker 92R (YES in S220-1, S220-2).

On the other hand, (ii) when the level of the music signal is greater than the threshold value or is at least the threshold value, the sound pickup signal $X_F$ is not output to the speaker 92R (NO in S220-1). This can also be said that a sound path from the microphone 91F to the speaker 92R is interrupted. In other words, (i) when the level of the music signal is not greater than the predetermined threshold value or is less than the threshold value, control is performed such that the sound pickup signal $X_F$ is played back from the speaker 92R at a sound amplification position, and (ii) when the level of the music signal is greater than the threshold value or is at least the threshold value, control is performed such that the sound pickup signal $X_F$ is not played back from the speaker 92R.

Note that the level of the music signal is input in the present embodiment, it is also possible to input the music signal itself and determine the level of the music signal (i.e., the absolute value or power, or a value obtained by performing time smoothing on the absolute value or power) in the sound pickup and amplification device.

<Effects>

According to the configuration described above, the sound amplification function can be automatically switched OFF if the environment in the vehicle is clearly not suitable for conversation with a passenger, such as a case in which audio is listened to at a large volume.

Third Embodiment

The following will primarily describe differences from the first embodiment.

Figure 8:
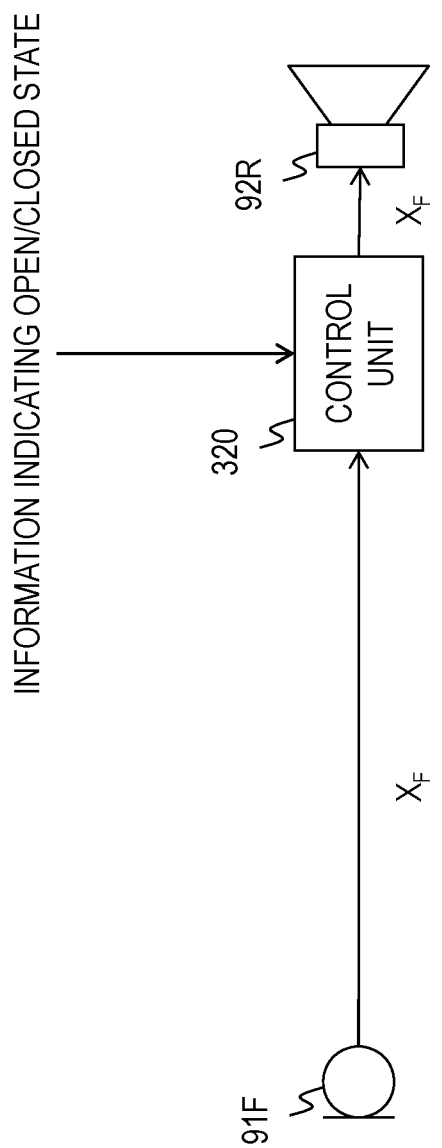
FIG. 8 is a function block diagram illustrating a sound pickup and amplification device according to a third embodiment.
Figure 9:
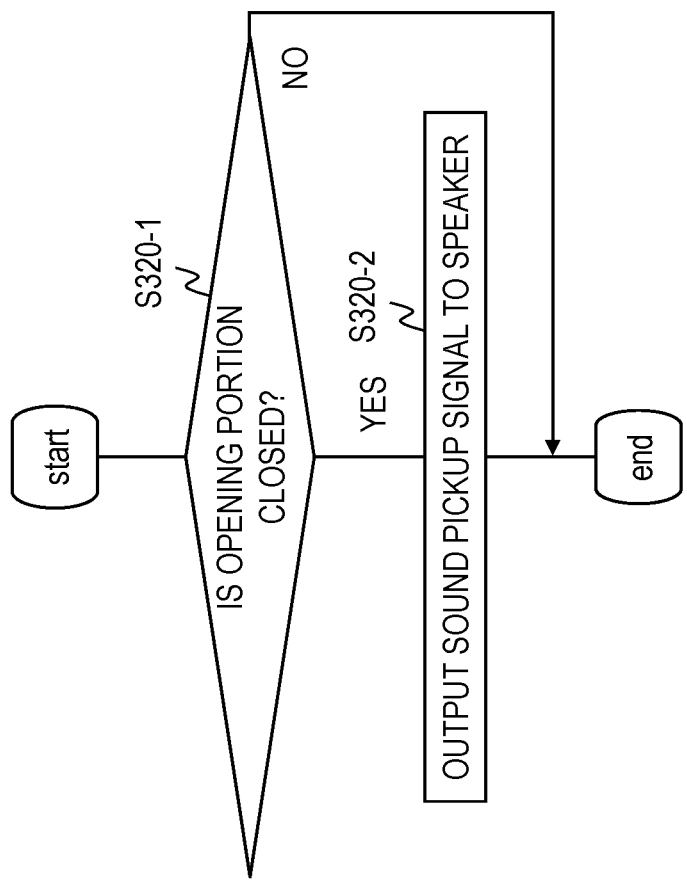
FIG. 9 is a diagram illustrating an example of a flow of processing by the sound pickup and amplification device according to the third embodiment.

FIG. 8 is a function block diagram illustrating a sound pickup and amplification device according to a third embodiment, and FIG. 9 illustrates a processing flow thereof.

The sound pickup and amplification device includes a control unit 320.

The sound pickup and amplification device takes, as inputs, a sound pickup signal $X_F$ obtained from the microphone 91F and information that indicates an open/closed state of a door, a window, or a back door, and outputs the sound pickup signal $X_F$ to the speaker 92R. An onboard system (not shown) is installed in a vehicle according to the present embodiment, and the above-described information indicating the open/closed state is output from the onboard system. The onboard system controls opening and closing means (a door, a window, a back door, or the like) that is disposed at an opening portion of the vehicle.

<Control Unit 320>

The control unit 320 takes the sound pickup signal $X_F$ and the information indicating the open/closed state as inputs, and (i) when the opening portion of the vehicle is closed by the opening and closing means disposed at the opening portion, outputs the sound pickup signal $X_F$ to the speaker 92R (YES in S320-1, S320-2).

On the other hand, (ii) when the opening portion is open, the sound pickup signal $X_F$ is not output to the speaker 92R (NO in S320-1). This can also be said that a sound path from the microphone 91F to the speaker 92R is interrupted. In other words, (i) when the opening portion is closed by the opening and closing means, control is performed such that the sound pickup signal $X_F$ is played back from the speaker 92R at a sound amplification position, and (ii) when the opening portion is opened by the opening and closing means, control is performed such that the sound pickup signal $X_F$ is not played back from the speaker 92R.

Note that information that is an output value of the onboard system and indicates an open/closed state is input in the present embodiment, but it is also possible to provide a sensor or the like for detecting an open/closed state of the opening and closing means and use an output value of the sensor as information indicating the open/closed state.

<Effects>

According to the configuration described above, it is possible to prevent a situation in which loud noise produced as a result of the wind blowing against the microphone is emitted from the speaker. Accordingly, opening and closing means that exposes the microphone to the wind when the opening and closing means is open can be used to determine whether or not to play back the sound pickup signal from the speaker. In a case in which open/closed states of a plurality of opening and closing means are used, OR can be used if loud noise is emitted from the speaker as a result of each opening and closing means being open (i.e., the sound path is interrupted when any one of the plurality of opening and closing means is open), and AND can be used if loud noise is emitted from the speaker only when two or more opening and closing means are open at the same time (i.e., the sound path is interrupted when a plurality of predetermined opening and closing means are open at the same time).

Fourth Embodiment

The following will primarily describe differences from the first embodiment.

In the present embodiment, a plurality of microphones is used, and whether or not the wind is blowing against the microphones is detected by observing a correlation between signals output from the microphones. More specifically, usually, a correlation (positive correlation) between the microphones is high in the case of the voice of a person speaking in the vehicle, but there is no correlation between the microphones in the case of noise produced as a result of the wind blowing against a microphone, and therefore whether or not the wind is blowing against the microphones is detected using this characteristic. That is, a correlation between the microphones is calculated, and if the correlation is low, it is determined that the wind is blowing against a microphone.

Figure 10:
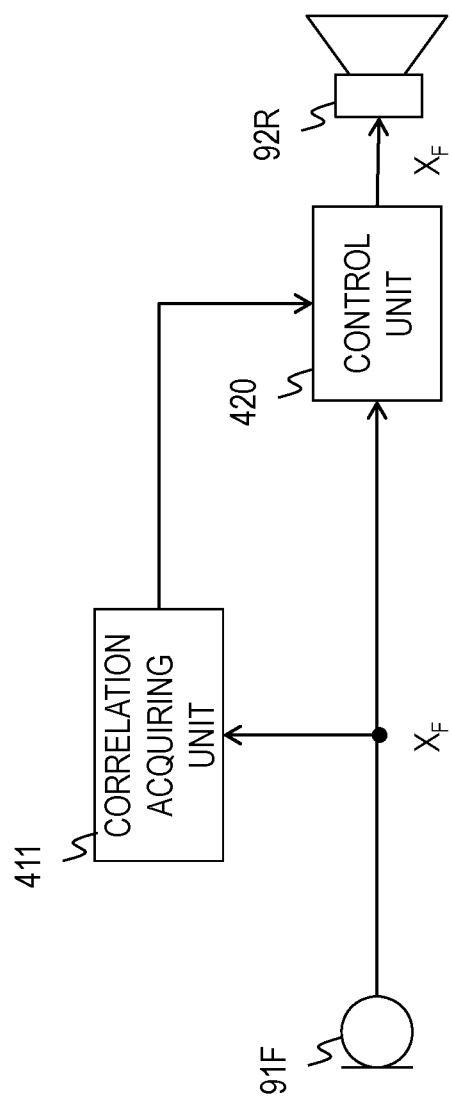
FIG. 10 is a function block diagram illustrating a sound pickup and amplification device according to a fourth embodiment.
Figure 11:
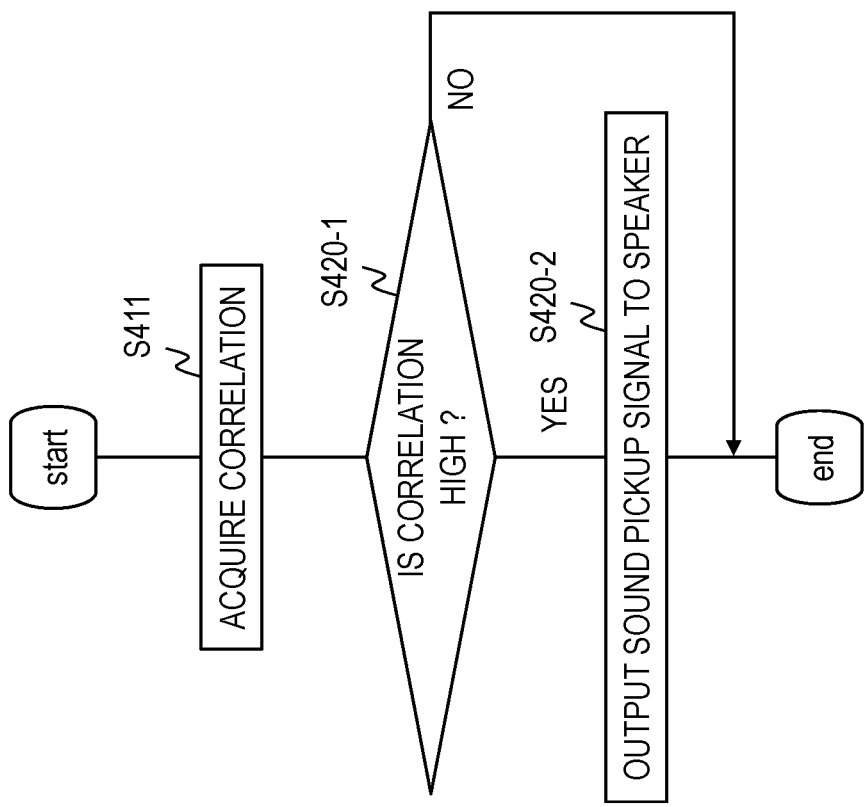
FIG. 11 is a diagram illustrating an example of a flow of processing by the sound pickup and amplification device according to the fourth embodiment.

FIG. 10 is a function block diagram illustrating a sound pickup and amplification device according to a fourth embodiment, and FIG. 11 illustrates a processing flow thereof.

The sound pickup and amplification device includes a correlation acquiring unit 411 and a control unit 420.

The sound pickup and amplification device takes a sound pickup signal $X_F=[X_{F,1}, X_{F,2}, \ldots, X_{F,M}]$ obtained from the microphone 91F as an input and outputs the sound pickup signal $X_F$ to the speaker 92R. Note that the microphone 91F is constituted by M microphones as described above, and M is any integer greater than or equal to 2 in the present embodiment.

<Correlation Acquiring Unit 411>

The correlation acquiring unit 411 takes the sound pickup signal $X_F=[X_{F,1}, X_{F,2}, \ldots, X_{F,M}]$ as an input, determines a correlation between M sound pickup signals $X_{F,m}$, and outputs the correlation. $m=1, 2, \ldots, M$. For example, coefficients of correlation between the M sound pickup signals $X_{F,m}$ are calculated and output.

<Control Unit 420>

The control unit 420 takes the sound pickup signal $X_F$ and the correlation between the M sound pickup signals $X_{F,m}$ as inputs, and (i) when the correlation is high, outputs the sound pickup signal $X_F$ to the speaker 92R (YES in S420-1, S420-2).

On the other hand, (ii) otherwise, the sound pickup signal $X_F$ is not output to the speaker 92R (NO in S420-1). This can also be said that a sound path from the microphone 91F to the speaker 92R is interrupted. In other words, (i) when the correlation is high, control is performed such that the M sound pickup signals are played back from the speaker at a sound amplification position, and (ii) otherwise, control is performed such that the M sound pickup signals are not played back from the speaker. For example, if all of the coefficients of correlation between the M sound pickup signals $X_{F,m}$ are greater than a predetermined threshold value, it is determined that the correlation is high, and if any of the coefficients of correlation is not greater than the predetermined threshold value, it is determined that the correlation is low.

<Effects>

According to the configuration described above, it is possible to prevent a situation in which loud noise produced as a result of the wind blowing against a microphone is emitted from the speaker.

Fifth Embodiment

The following will primarily describe differences from the first embodiment.

In the present embodiment, a sound path from the microphone to the speaker is interrupted if an extremely loud sound is input to the microphone, such as a case in which the microphone is rubbed with a hand, the wind blows against the microphone, or the sound of opening or closing a door is input.

Figure 12:
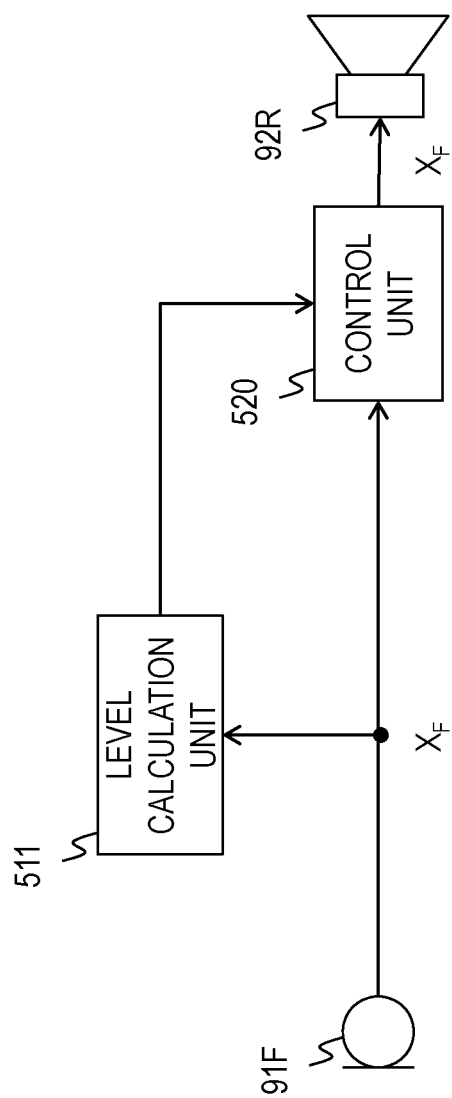
FIG. 12 is a function block diagram illustrating a sound pickup and amplification device according to a fifth embodiment.
Figure 13:
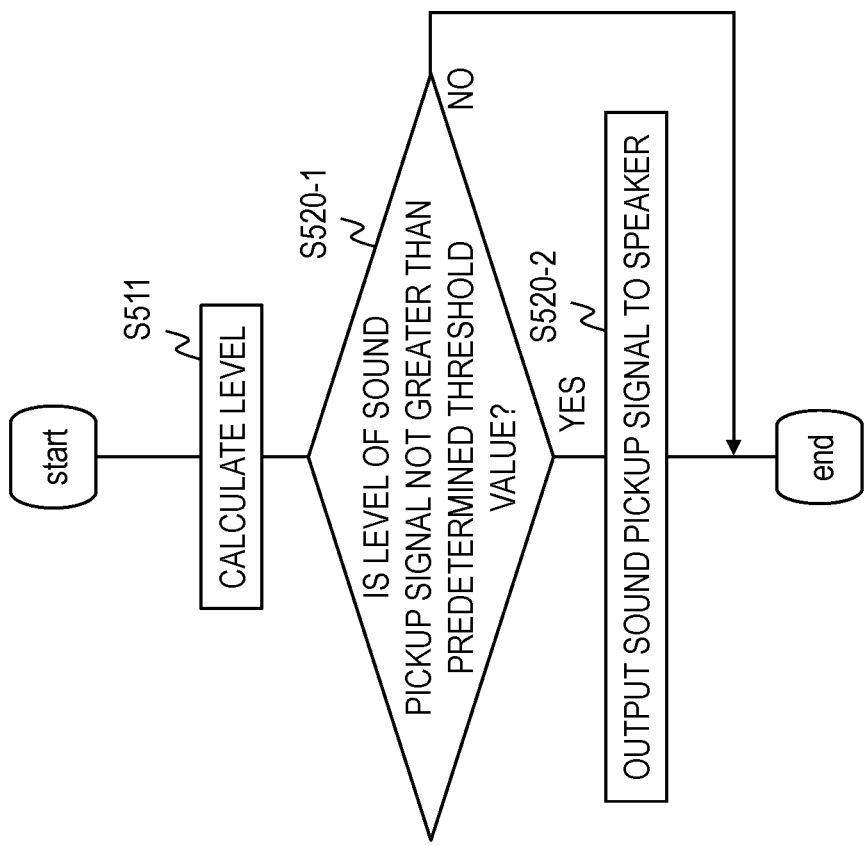
FIG. 13 is a diagram illustrating an example of a flow of processing by the sound pickup and amplification device according to the fifth embodiment.

FIG. 12 is a function block diagram illustrating a sound pickup and amplification device according to a fifth embodiment, and FIG. 13 illustrates a processing flow thereof.

The sound pickup and amplification device includes a level calculation unit 511 and a control unit 520.

The sound pickup and amplification device takes a sound pickup signal $X_F$ obtained from the microphone 91F as an input and outputs the sound pickup signal $X_F$ to the speaker 92R.

<Level Calculation Unit 511>

The noise level estimation unit 511 takes the sound pickup signal $X_F$ as an input, determines the level of the sound pickup signal $X_F$ (S511), and outputs the level. The absolute value or power of the sound pickup signal $X_F$, or a value obtained by performing time smoothing on the absolute value or power can be used as the level of the sound pickup signal $X_F$.

<Control Unit 420>

The control unit 420 takes the sound pickup signal $X_F$ and the level of the sound pickup signal $X_F$ as inputs, and (i) when the level of the sound pickup signal $X_F$ is not greater than a predetermined threshold value or is less than the threshold value, outputs the sound pickup signal $X_F$ to the speaker 92R (YES in S520-1, S520-2).

On the other hand, (ii) when the level of the sound pickup signal is greater than the threshold value or is at least the threshold value, the sound pickup signal $X_F$ is not output to the speaker 92R (NO in S520-1). In other words, (i) when the level of the sound pickup signal is not greater than the predetermined threshold value or is less than the threshold value, control is performed such that the sound pickup signal is played back from the speaker at a sound amplification position, and (ii) when the level of the sound pickup signal is greater than the threshold value or is at least the threshold value, control is performed such that the sound pickup signal is not played back from the speaker.

<Effects>

According to the configuration described above, loud noise can be kept from being emitted from the speaker by interrupting a sound path from the microphone to the speaker if an extremely loud sound is input to the microphone, such as a case in which the microphone is rubbed with a hand, the wind blows against the microphone, or the sound of opening or closing a door is input.

<Other Variations>

The present invention is not intended to be limited to the embodiments and variations described thus far. For example, the various types of processing described above need not be executed in time series as per the descriptions, and may instead be executed in parallel or individually as necessary or in accordance with the processing capabilities of the device executing the processing. Other changes can be made as appropriate within a scope that does not depart from the essential spirit of the present invention.

<Program and Recording Medium>

Additionally, the various processing functions in each device described in the foregoing embodiments and variations may be implemented by a computer. In this case, the processing details of the functions which the apparatus is to have are written in a program. The various processing functions in each device described above are implemented by the computer as a result of the computer executing the program.

The program in which the processing details are written can be recorded into a computer-readable recording medium. Magnetic recording devices, optical discs, magneto-optical recording media, semiconductor memory, and the like are examples of computer-readable recording media.

Additionally, the program is distributed by, for example, selling, transferring, or lending portable recording media such as DVDs and CD-ROMs in which the program is recorded. Furthermore, the program may be distributed by storing the program in a storage device of a server computer and transferring the program from the server computer to another computer over a network.

A computer executing such a program first stores the program recorded on the portable recording medium or the program transferred from the server computer in its own storage unit, for example. Then, when executing the processing, the computer reads the program stored in its own storage unit and executes the processing in accordance with the read program. As another embodiment of this program, the computer may read the program directly from a portable recording medium and execute processing according to the program. Furthermore, each time a program is transferred to the computer from the server computer, processing according to the received programs may be executed sequentially. Additionally, the configuration may be such that the above-described processing is executed by what is known as an ASP (Application Service Provider)-type service that implements the functions of the processing only by instructing execution and obtaining results, without transferring the program from the server computer to the computer in question. Note that the program includes information that is provided for use in processing by an electronic computer and that is based on the program (such as data that is not a direct command to a computer but has a property of defining processing by the computer).

Additionally, although each device is configured by causing a computer to execute a predetermined program, the details of the processing may be at least partially realized by hardware.

The invention claimed is:

1. An acoustic signal processing apparatus for installation in a vehicle, wherein at least a sound pickup position and a sound amplification position are assumed to be present in the vehicle, the apparatus comprising:
processing circuitry configured to:
perform control such that:
(i) when an opening portion of the vehicle is closed by opening and closing means disposed at the opening portion, an acoustic signal based on a sound pickup signal obtained from a microphone that collects sound emitted from the sound pickup position is played back from a speaker at the sound amplification position; and
(ii) when the opening portion is open, the acoustic signal is not played back from the speaker to stop a sound amplification function in order to prevent propagating unintended sound.

2. An acoustic signal processing apparatus to be installed in a vehicle, wherein at least a sound pickup position and a sound amplification position are assumed to be present in the vehicle, the apparatus comprising:
processing circuitry configured to:
determine a level of a sound pickup signal obtained from a microphone that collects sound emitted from the sound pickup position; and
perform control such that (i) when the level of the sound pickup signal is not greater than a predetermined threshold value or is less than the threshold value, an acoustic signal based on the sound pickup signal is played back from a speaker at the sound amplification position, and (ii) when the level of the sound pickup signal is greater than the threshold value or is at least the threshold value, the acoustic signal is not played back from the speaker to stop a sound amplification function in order to prevent propagating unintended sound.

3. An acoustic signal processing method using an acoustic signal processing apparatus that includes processing circuitry and is installed in a vehicle, wherein at least a sound pickup position and a sound amplification position are assumed to be present in the vehicle, the method comprising:
a control step of the processing circuitry performing control such that (i) when an opening portion of the vehicle is closed by opening and closing means disposed at the opening portion, an acoustic signal based on a sound pickup signal obtained from a microphone that collects sound emitted from the sound pickup position is played back from a speaker at the sound amplification position, and (ii) when the opening portion is open, the acoustic signal is not played back from the speaker to stop a sound amplification function in order to prevent propagating unintended sound.

4. An acoustic signal processing method using an acoustic signal processing apparatus that includes processing circuitry and is installed in a vehicle, wherein at least a sound pickup position and a sound amplification position are assumed to be present in the vehicle, the method comprising:
a sound pickup signal level calculation step of the processing circuitry determining a level of a sound pickup signal obtained from a microphone that collects sound emitted from the sound pickup position; and
a control step of the processing circuitry performing control such that (i) when the level of the sound pickup signal is not greater than a predetermined threshold value or is less than the threshold value, an acoustic signal based on the sound pickup signal is played back from a speaker at the sound amplification position, and (ii) when the level of the sound pickup signal is greater than the threshold value or is at least the threshold value, the acoustic signal is not played back from the speaker to stop a sound amplification function in order to prevent propagating unintended sound.

5. A non-transitory computer-readable recording medium on which a program for causing a computer to function as the acoustic signal processing apparatus according to claim 1 or 2.

* * * * *